(12) United States Patent
Feng et al.

(10) Patent No.: US 7,280,007 B2
(45) Date of Patent: Oct. 9, 2007

(54) THIN FILM BULK ACOUSTIC RESONATOR WITH A MASS LOADED PERIMETER

(75) Inventors: Hongjun Feng, Windsor, CO (US); R. Shane Fazzio, Loveland, CO (US); Richard Ruby, Menlo Park, CA (US); Paul Bradley, Los Altos, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 152 days.

(21) Appl. No.: 10/990,201

(22) Filed: Nov. 15, 2004

(65) Prior Publication Data

US 2006/0103492 A1    May 18, 2006

(51) Int. Cl.
*H03H 9/00* (2006.01)
*H03H 9/09* (2006.01)

(52) U.S. Cl. ............................. 333/187; 333/188
(58) Field of Classification Search ............ 333/187, 333/188, 189; 310/326
See application file for complete search history.

(56) References Cited

U.S. PATENT DOCUMENTS 6,788,170 B1 *  9/2004  Kaitila et al. ............... 333/187

6,842,088 B2   1/2005  Yamada et al.

FOREIGN PATENT DOCUMENTS

| EP | 0 973 256 A1 | 1/2000 |
|---|---|---|
| EP | 1 249 932 A3 | 10/2002 |
| EP | 1 258 989 A3 | 11/2002 |
| WO | WO 01/06647 A1 | 1/2001 |

OTHER PUBLICATIONS

H.F. Tiersten and D.S. Stevens; An analysis of thickness-extensional trapped energy resonant device structures with rectangular electrodes in the piezoelectric thin film on silicon configuration J. Appl. Phys. 54 (10), Oct. 1983; pp. 5893-5910.

* cited by examiner

Primary Examiner—Dean Takaoka

(57) ABSTRACT

A resonator structure (FBAR) made of electrodes sandwich a piezoelectric material. The intersection of the two conducting electrodes defines the active area of the acoustic resonator. The active area is divided into two concentric areas; a perimeter or frame, and a central region. An annulus is added to one of the two conducting electrodes to improve the electrical performance (in terms of Q).

19 Claims, 19 Drawing Sheets

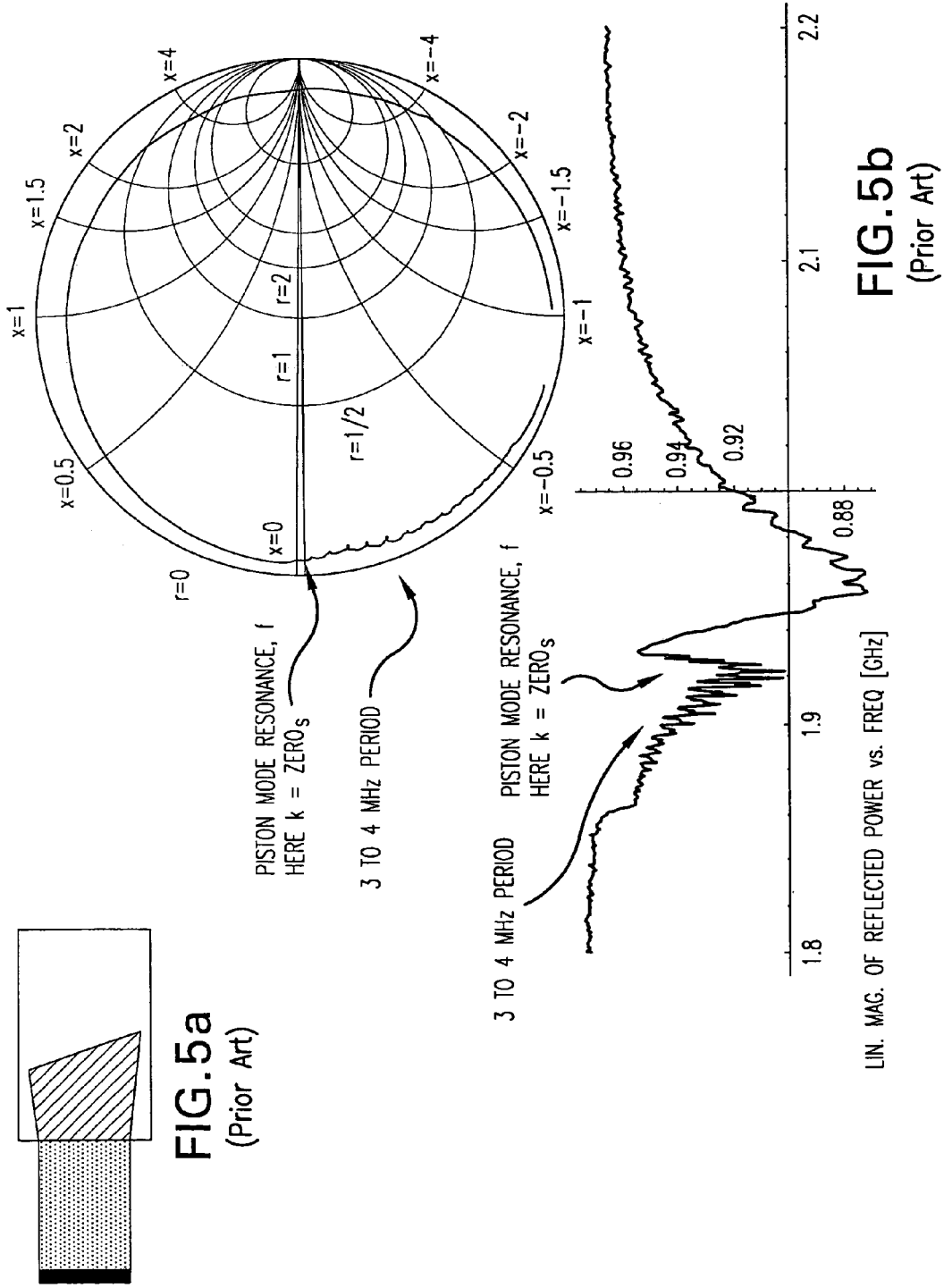

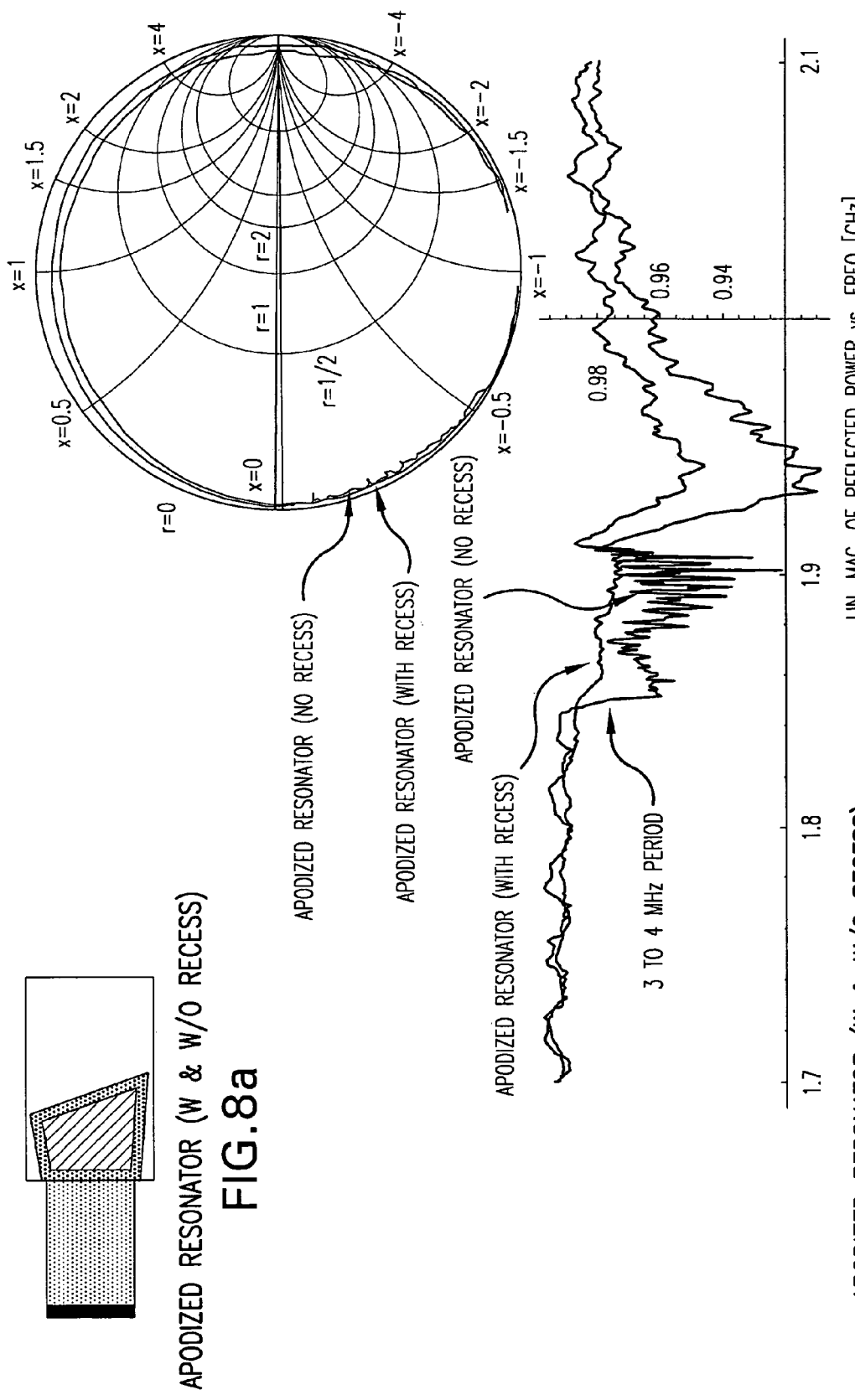

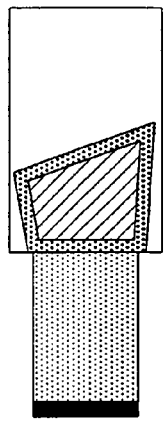
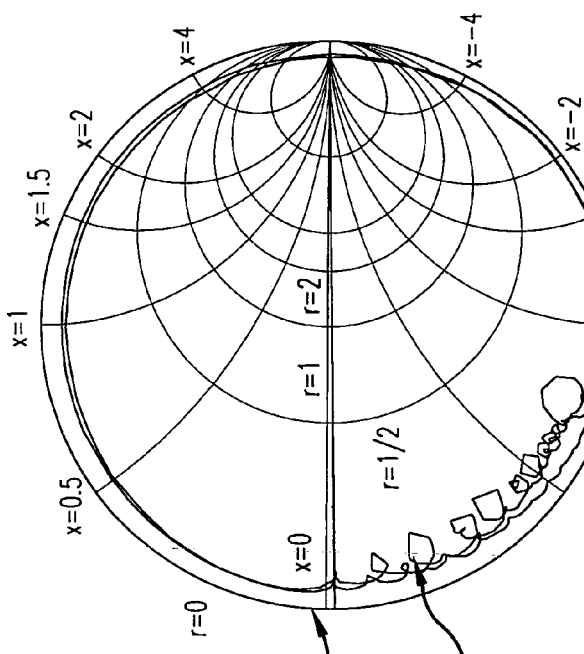
FIG. 9a APODIZED RESONATOR (W & W/O FRAME)
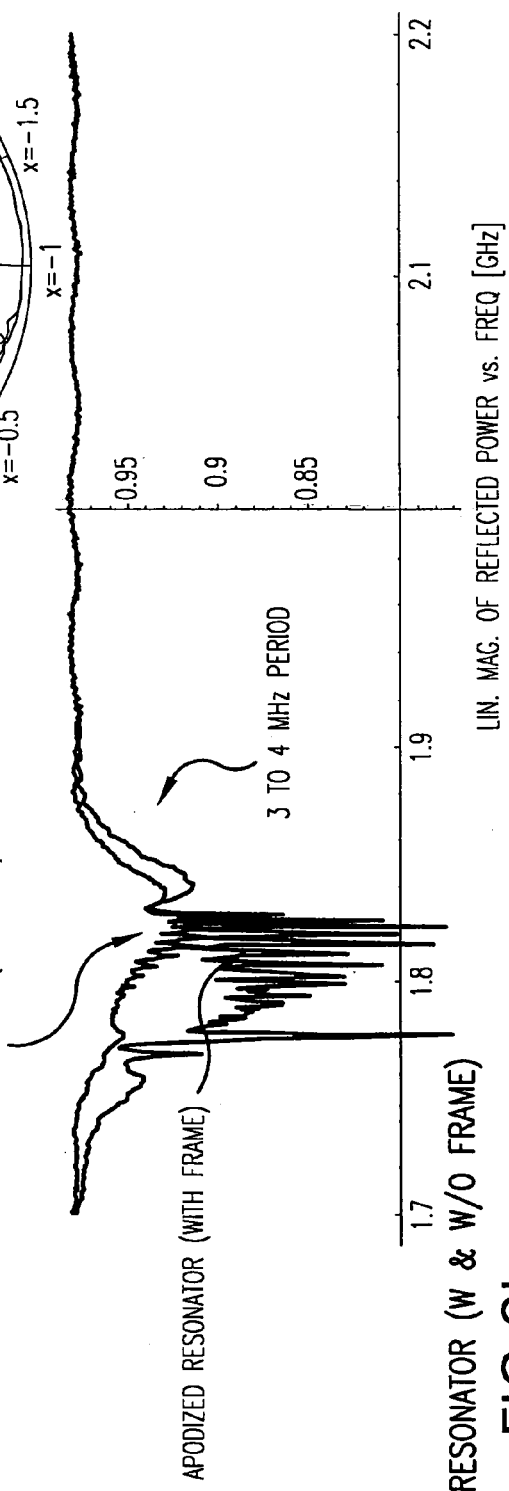
FIG. 9b APODIZED RESONATOR (W & W/O FRAME)

BLUE= LOW FREQ BAND EDGE (1915 MHz)
RED= HIGH FREQ BAND EDGE (1985 MHz)

SERIES RESONATOR WITH NO ML m24
FREQ= 1.91500GHz
m24= 0.97802/−129.14156
IMPEDANCE= ZO *(0.014 − j0.475)

m25
FREQ= 1.98500GHz
m25= 0.95418/152.77773
IMPEDANCE= ZO *(0.025 + j0.242)

BLUE= LOW FREQ BAND EDGE (1915 MHz)
RED= HIGH FREQ BAND EDGE (1985 MHz)

SHUNT RESONATOR WITH ML1 m26
FREQ= 1.91500GHz
m26= 0.96026/170.17771
IMPEDANCE= ZO *(0.020 + J0.086)

m27
FREQ= 1.98500GHz
m27= 0.96323/−28.56455
IMPEDANCE= ZO *(0.306 − j3.906)

BLUE= LOW FREQ BAND EDGE (1915 MHz)
RED= HIGH FREQ BAND EDGE (1985 MHz)

SHUNT RESONATOR WITH ML1 & ML2 m28
FREQ= 1.91500GHz
m28= 0.93898/87.59754
IMPEDANCE= Z0 *(0.06562 + j1.04068)

m29
FREQ= 1.98500GHz
m29= 0.96987/−50.54064
IMPEDANCE= Z0 *(0.08383 − j2.11564)

THIN FILM BULK ACOUSTIC RESONATOR WITH A MASS LOADED PERIMETER

BACKGROUND

A typical thin film bulk acoustic resonator (FBAR) is a tri-layer device that includes a bottom electrode and a top electrode made, for example, from molybdenum. Piezoelectric material, e.g. aluminum nitride (AlN), interposes the two electrodes. This device is deposited over a depression or "swimming pool" made into a substrate, e.g. silicon, where this depression is filled with a sacrificial material, as disclosed by Ruby, et al. in "SBAR Structures and Method of Fabrication of SBAR/FBAR Film Processing Techniques for the Manufacturing of SBAR/FBAR Filters", U.S. Pat. No. 6,060,818, issued 9 May 2000, assigned to Agilent Technologies. When the sacrificial material is removed, a "free-standing membrane" is created where the edges of the resonator are anchored around the perimeter to the silicon substrate. FIG. 1 shows a cleaved portion of a prior art acoustic resonator over the pool and anchored at the edge of the pool and then connected to a pad.

The active area of this resonator is defined by the overlap between the top and bottom electrodes. Typically, the bottom electrode spans the entire swimming pool to maximize mechanical robustness, as disclosed by Ruby, et al. in "Cavity spanning Bottom Electrode of a Substrate-Mounted Bulk Acoustic Resonator", U.S. Pat. No. 6,384,697, issued 7 May 2002, assigned to Agilent Technologies. The top electrode is pulled inside of the swimming pool (where possible) by an amount that maximizes the Q of the system as taught in Ruby, et al. in "Bulk Acoustic Perimeter Reflection System", U.S. Pat. No. 6,424,237, issued 23 Jul. 2002, assigned to Agilent Technologies.

The resonator may also include a mass-loading layer substantially covering the total area of the top electrode. This layer lowers the resonant frequency of the resonator. This layer allows for differentiation by frequency for filters using ladder, half-ladder or lattice type topologies. A half-ladder filter is made of cascaded series and shunt resonators. Mass loading lowers the frequencies of the shunts relative to the series resonators.

For these filters to be successful, the quality factor or Q of each of the resonators comprising the filter must be very high. The Q is the amount of radio frequency (rf) energy stored in the resonator divided by the amount of energy lost to the resonator by various means. If there is no loss of energy in the resonator, the Q would be infinite. The actual energy stored in the resonator at this frequency is in the form of mechanical motion. There is, however, always some loss. One loss mechanism is thermal acoustic loss where mechanical energy that is converted into heat, e.g. energy lost to the system as heat, is not readily converted back into rf energy.

Energy loss at the edges comes from two sources. First, acoustic energy converted into in the form of lateral modes can leak out from the sides of the resonator and escapes into the substrate. Very little of this energy is recovered by the resonator. Second, there is typically poor delineation and quality of the films at the edges due to these edges being exposed to various dry and wet chemical processes. Lateral modes will "sample" these rough edges and lose energy through scattering off the rough edges and through acoustic migration of atoms at the edges. Thus, it is important to minimize the interaction of lateral modes with the edges of the resonators.

SUMMARY

The Q of the lossy lateral modes in a thin film bulk acoustic resonator (FBAR) is increased by creating a very well-defined acoustic impedance mismatch, e.g. approximately a quarter wavelength wide (or multiples of a quarter wavelength) away from the edge of the active area of the FBAR, such that the lateral modes are reflected from this edge prior to "sampling" any defects. The improved Q enhances yields of filters and duplexers built from FBAR resonator building blocks.

The overall Q of the resonator is improved by better trapping the lateral modes and improving the Q's of these lateral modes. This, in turn, raises the Q of the entire resonator system including the fundamental mode. This is done by adding an annulus to at least one of the two electrodes along the perimeter of the active area defining the resonator.

A resonator structure (FBAR) is made of two electrodes that sandwich a piezoelectric material. The intersection of the two conducting electrodes defines the active area of the acoustic resonator. The active area is divided into two concentric areas; a perimeter or frame, and a central region. An annulus is added to one of the two conducting electrodes to improve the electrical performance (in terms of Q).

BRIEF DESCRIPTION OF THE DRAWINGS

FIG. 3a shows a prior art FBAR. FIG. 3b shows a prior art apodized FBAR with recessed annulus. FIG. 3c shows the current invention.

FIG. 5a is the Q circle of an apodized resonator with the cross section given in FIG. 3a. Plotted in FIG. 5b is the magnitude of $\Gamma$ versus frequency.

FIG. 7 is the measured and fitted data for the w-k diagram of the first 4 lateral modes (S0, S1 and A0,A1), typically referred to as Lamb waves, for the resonator shown in FIG. 3a.

FIGS. 8a and 8b are the Q circles of the resonator shown in FIGS. 3a and 3b (with no annulus and with a recessed annulus). Plotted in FIG. 8b is the magniture of $\Gamma$ versus frequency for the two cross sections.

FIGS. 9a and 9b are the Q circles of the resonator shown in FIGS. 3a and 3c (with no annulus and with a raised annulus). Plotted in FIG. 9b is the magnitude of $\Gamma$ versus frequency for the two cross sections.

FIG. 14B is a blow up of the passband. The figure is of two different filter designs with and without the raised frames on the shunts.

DETAILED DESCRIPTION

The fundamental mode of a film bulk acoustic resonator (FBAR) is the longitudinal extension mode or "piston" mode. This mode is excited by the application of an ac voltage to the two electrodes at the resonant frequency of the FBAR. The piezoelectric material converts energy in the form of electrical energy into mechanical energy. In an ideal FBAR having infinitesimally thin electrodes, resonance occurs when the applied frequency is equal to the velocity of sound of the piezoelectric medium divided by twice the thickness of the piezoelectric medium: $f = v_{ac}/(2*T)$, where T is the thickness of the piezoelectric medium and $v_{ac}$ is the acoustic phase velocity. For resonators with finite thickness electrodes, this equation is modified by the weighted velocities and thicknesses of the electrodes.

Figure 1:
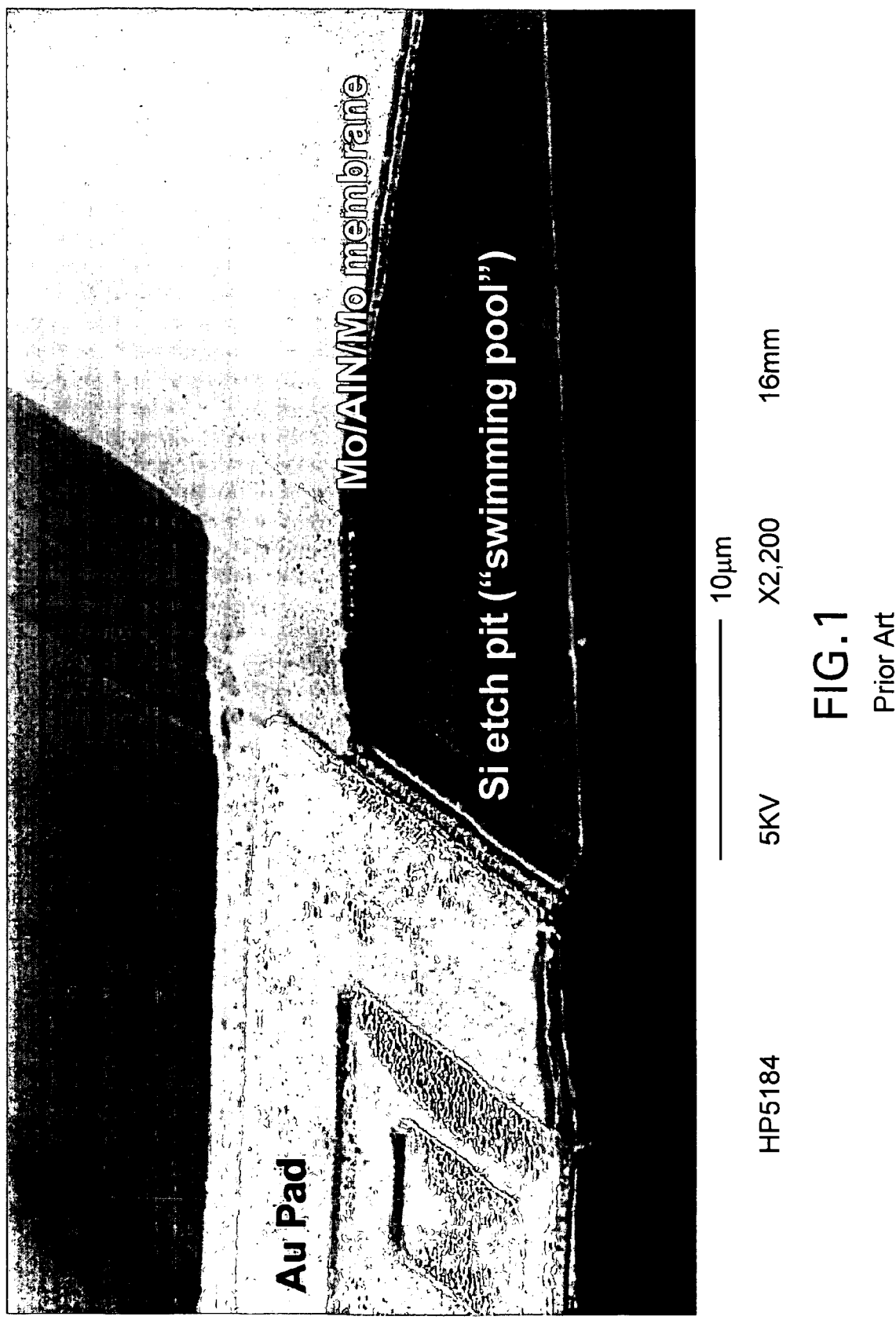
FIG. 1 is a SEM of a cross section of a prior art FBAR.
Figure 2A:
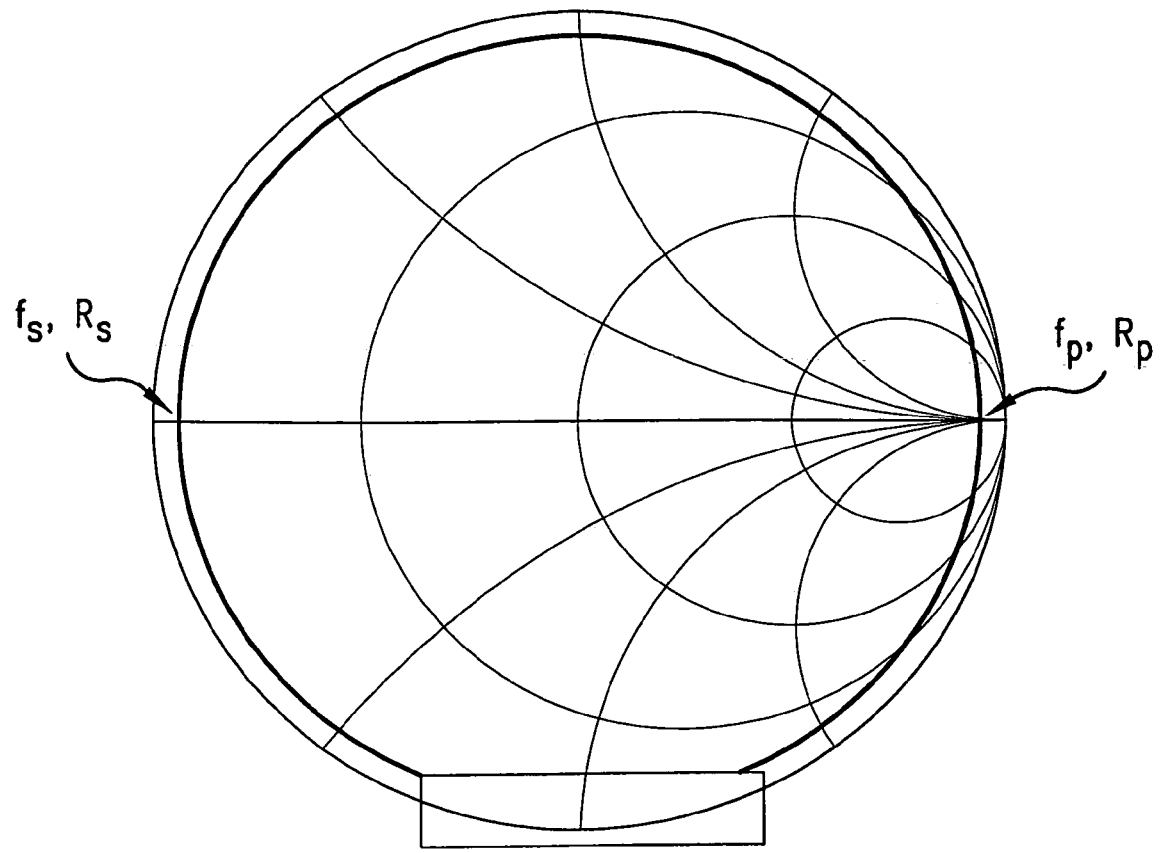
FIGS. 2A and 2B illustrate an idealized Q-circle and a Q circle of an apodized resonator on a Smith Chart Plot. These plots also label $R_s$, $f_s$, $R_p$ and $f_p$ of the resonator and the relationship between $Q_p$ and $R_p$ as well as $Q_s$ and $R_s$.
Figure 2B:
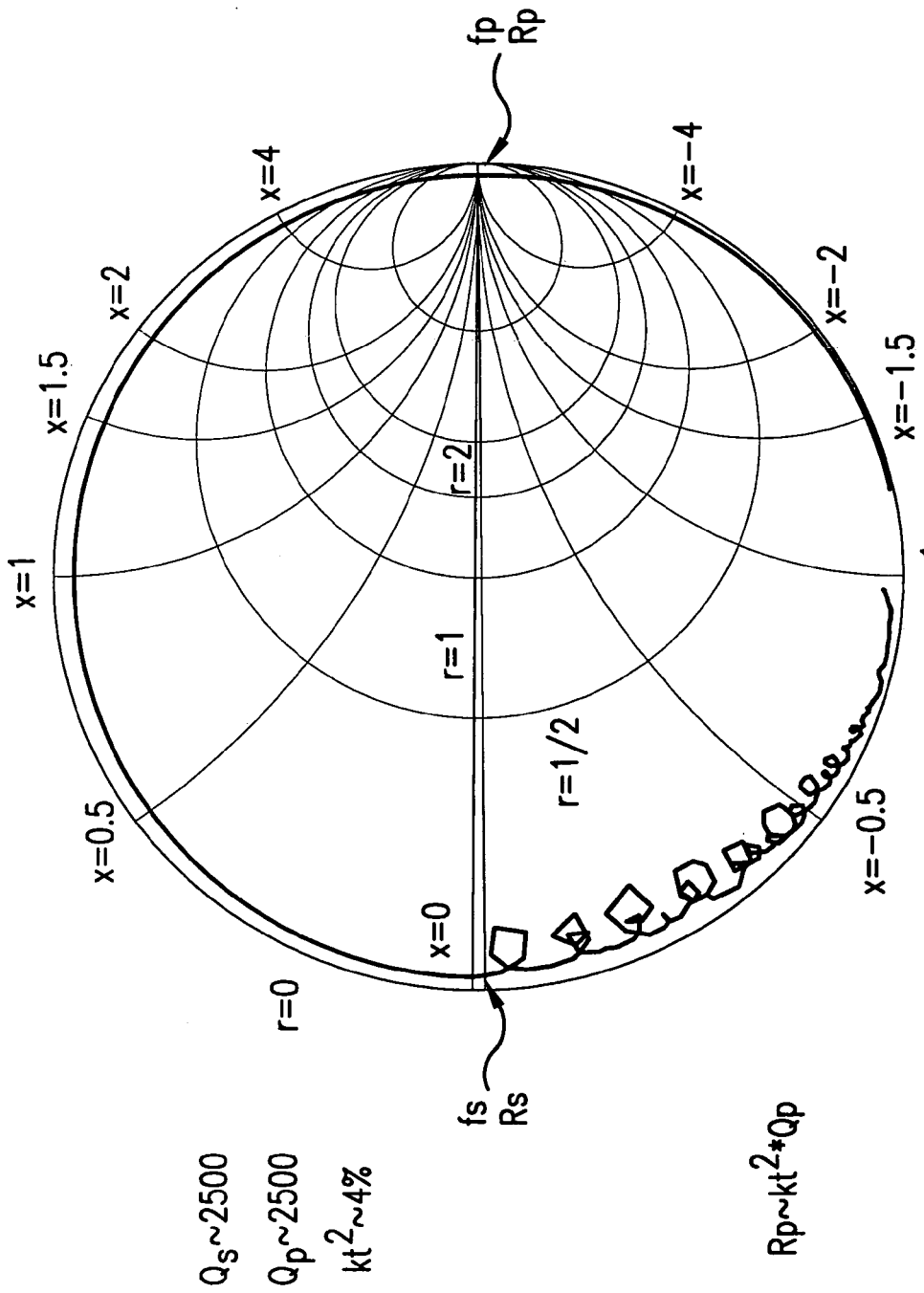

One can get both a quantitative and qualitative understanding of the Q of a resonator by plotting on a Smith Chart the ratio of the reflected energy to applied energy ($\Gamma$) as the frequency is varied. As the frequency of the applied energy is increased, the magnitude/phase of the FBAR resonator sweeps out a circle on the Smith Chart. This is referred to as the Q-circle. Where the Q-circle first crosses the real axes (horizontal axes), this corresponds to the frequency of the piston mode $f_s$. The real impedance (as measured in Ohms) is $R_s$. As the Q-circle continues around the perimeter of the Smith chart, it again crosses the real axes. The second point at which the Q circle crosses the real axis is labeled $f_p$, the anti-resonant frequency of the FBAR. The residual real part of the impedance is labeled $R_p$. FIG. 2a shows a Q-circle of an idealized FBAR with no spurious resonances. FIG. 2b shows the Q-circle of a prior art FBAR. Spurious resonances can be seen below $f_s$ in the lower south-west quadrant of the Q-circle. For filter applications, it is desirable to minimize $R_s$ while maximizing $R_p$. Qualitatively, the closer the Q-circle "hugs" the rim of the Smith chart, the higher the Q of the device. If there were such a thing as a lossless resonator, the Q-circle would have a radius of one and would be at the edge of the Smith chart.

Figure 3A:
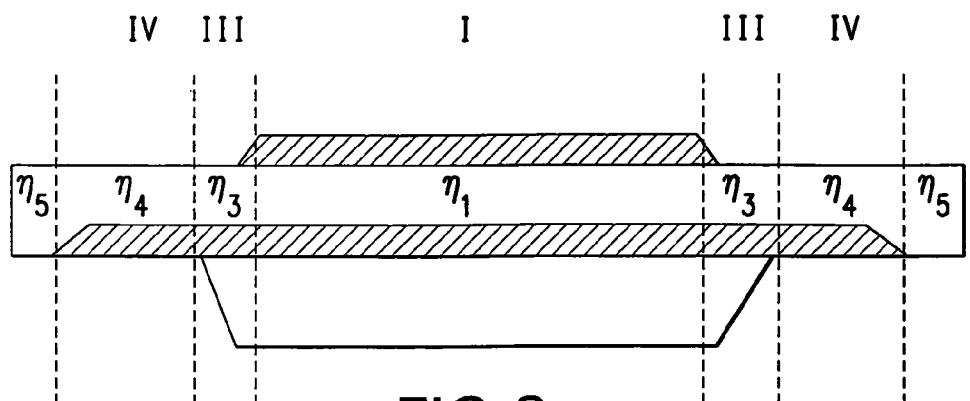
FIGS. 3a–c are schematic cross sections of a free standing FBAR.
Figure 3B:
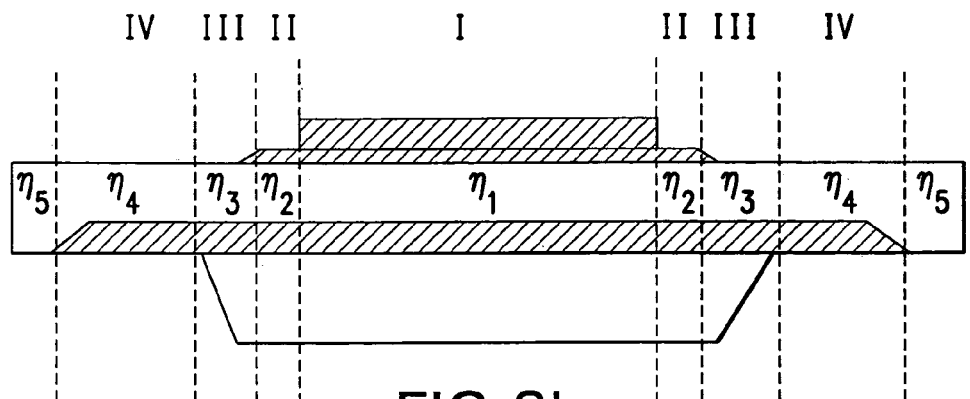

For any piezoelectric material, there are lateral modes in addition to the piston mode. These modes are easily excited. The boundary conditions that create lateral mode resonances are defined by the edges of the resonator. FIG. 3A is a cross sectional embodiment of a prior art FBAR. Dotted lines delineate various regions of this resonator. FIG. 3B illustrates a prior art FBAR having a recessed perimeter on the top surface of the electrode. For both examples, the FBAR includes a Type II piezoelectric material, e.g. AlN.

In FIG. 3A, the edges defined by the patterning of the top electrode form one set of boundary conditions and the edges of the swimming pool form another set of boundary conditions for lateral mode resonances. Lateral mode resonances are referred to as spurious modes and are generally undesirable, due to their ability to couple energy out of the resonator.

One approach to minimize the lateral modes is to "apodize" the edges of the resonator. Apodization is a set of design rules that will not allow any two edges of the resonator to be parallel. Furthermore, "right-angle" corners are replaced by carefully chosen angles such that any resonances are reduced by 10% or more of their original intensity as seen in a square or rectangular resonator, as taught by Larson, et al. in "Bulk Acoustic wave Resonators with Improved Lateral Mode Suppression", U.S. Pat. No. 6,215,375, issued 10 Apr. 2001, assigned to Agilent Technologies. FIG. 2b shows the Q-circle of an apodized FBAR. Note, although discrete spurious resonances above $f_s$ appear to be eliminated, spurious modes below $f_s$ are still evident. With apodization, the only spurious modes that exist strongly are those modes whose frequencies are less than $f_s$, the resonance of the "piston" mode. This mirrors the fact that AlN is a Type II piezoelectric.

For the weaker lateral acoustic modes existing above $f_s$, apodization forces the spurious lateral modes to go thru many reflections off non-parallel edges thereby lowering the fundamental spurious resonant frequency. Thus, those resonances that exist in the frequencies of interest, e.g. the PCS bands for CDMA phones in the 1850 to 1910 MHz transmit band, are at very high harmonics of the fundamental parasitic lateral mode. However, coupling energy into these modes goes as the inverse of the order of the $n^{th}$ harmonic. If by apodization, one takes the $50^{th}$ harmonic of a $v_{ac}/2L$ lateral mode, where L is the lateral separation between the edges of a square resonator (the $50^{th}$ harmonic is approximately the appropriate harmonic since lateral dimensions are about 50 to 100× larger than the thickness of the vertical thickness—which is the dimension behind the piston mode) to the $10,000^{th}$ harmonic (assuming the path length of the reflected lateral modes bouncing around in the resonator takes about 10,000 reflections before completing a circuit), then the coupling to this parasitic lateral mode is reduced by $50/10,000$.

One aspect of this approach to "smearing" out lateral mode spurious resonances is that each lateral mode resonance loses a small amount of energy at almost every frequency (rather than at a few discrete frequencies related to the nth harmonic of the $v_{ac}/2L$ fundamental). The effect of apodization on the Q circle is that it smooths out the measured Q-circle but causes the Q-circle to pull inward from the edge of the Smith chart, i.e., an indication of a lower Q.

Figure 4A:
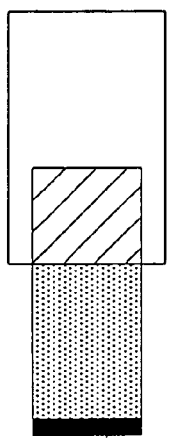
FIG. 4a is the Q circle of a square resonator with the cross section given in FIG. 3a. Plotted in FIG. 4b is the magnitude of $\Gamma$ versus frequency.
Figure 4B:
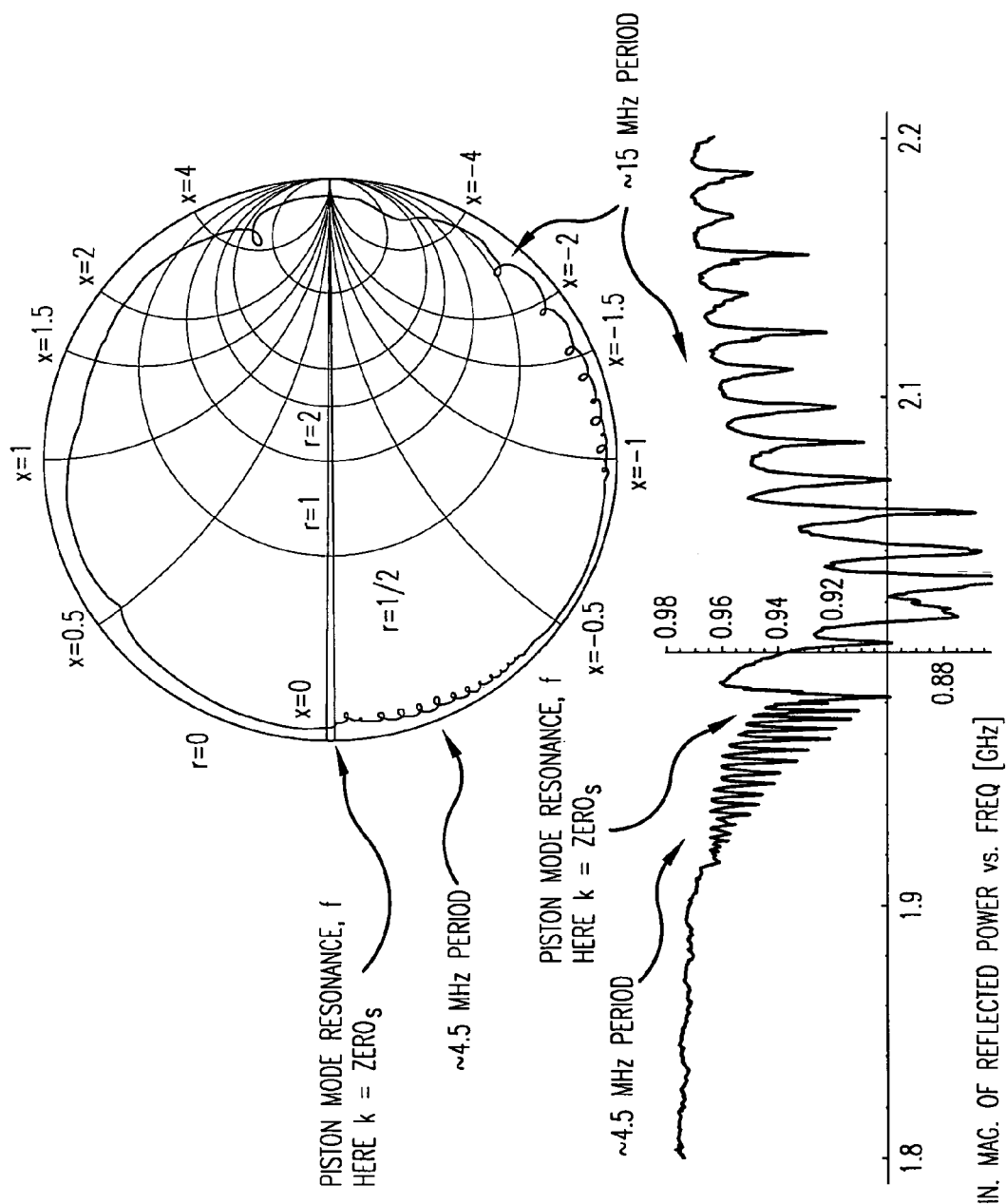

FIGS. 4a and b shows the Q circle (4a) and the $\Gamma$ vs frequency (4b) for a square resonator. FIGS. 5a and b shows the Q circle (5a) and the $\Gamma$ vs frequency (5b) for an apodized resonator. $\Gamma$ is the reflection coefficient.

In W0106647A1, "Resonator Structure and Filter Comprising a Resonator Structure," Kaitila et al. teach methods of reducing the spurious modes due to lateral modes that occur near the frequency of the piston mode.

Figure 6:
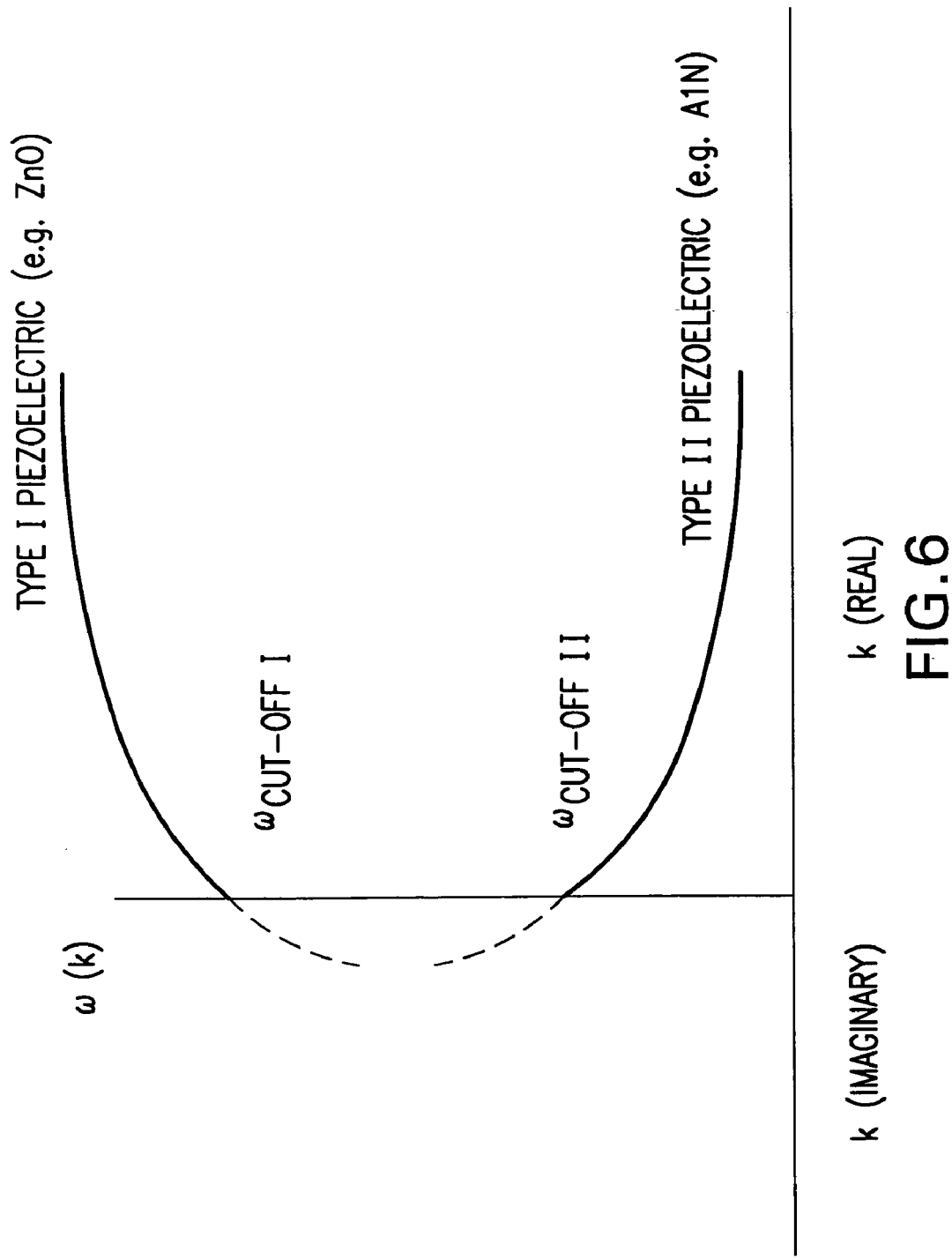
FIG. 6 is a pictorial w-k diagram of a Type I and Type II piezoelectric material.

FIG. 6 highlights the w-k diagram for a Type I and Type II piezoelectric film (as shown in Kaitila et. al.). For a free standing membrane, Kaitila teaches that ZnO, is a Type I piezoelectric material and that aluminum nitride, AlN, is a Type II piezoelectric material. In FIG. 6, the solid lines represent real k values for the piezoelectric and the dotted lines represent k values that are imaginary. For imaginary k values, the propagating wave is an exponentially decaying wave and not of interest for this discussion. For real k values, the wave is either a traveling wave or a standing wave. The point where k=0 in FIG. 6 represents the cut-off frequency and is the fundamental frequency of the extensional or longitudinal mode. In the case of ZnO, the critical lateral mode exists for frequencies above the piston mode. For AlN, the critical lateral mode, S1, exists at frequencies below the piston mode frequency.

Figure 7:
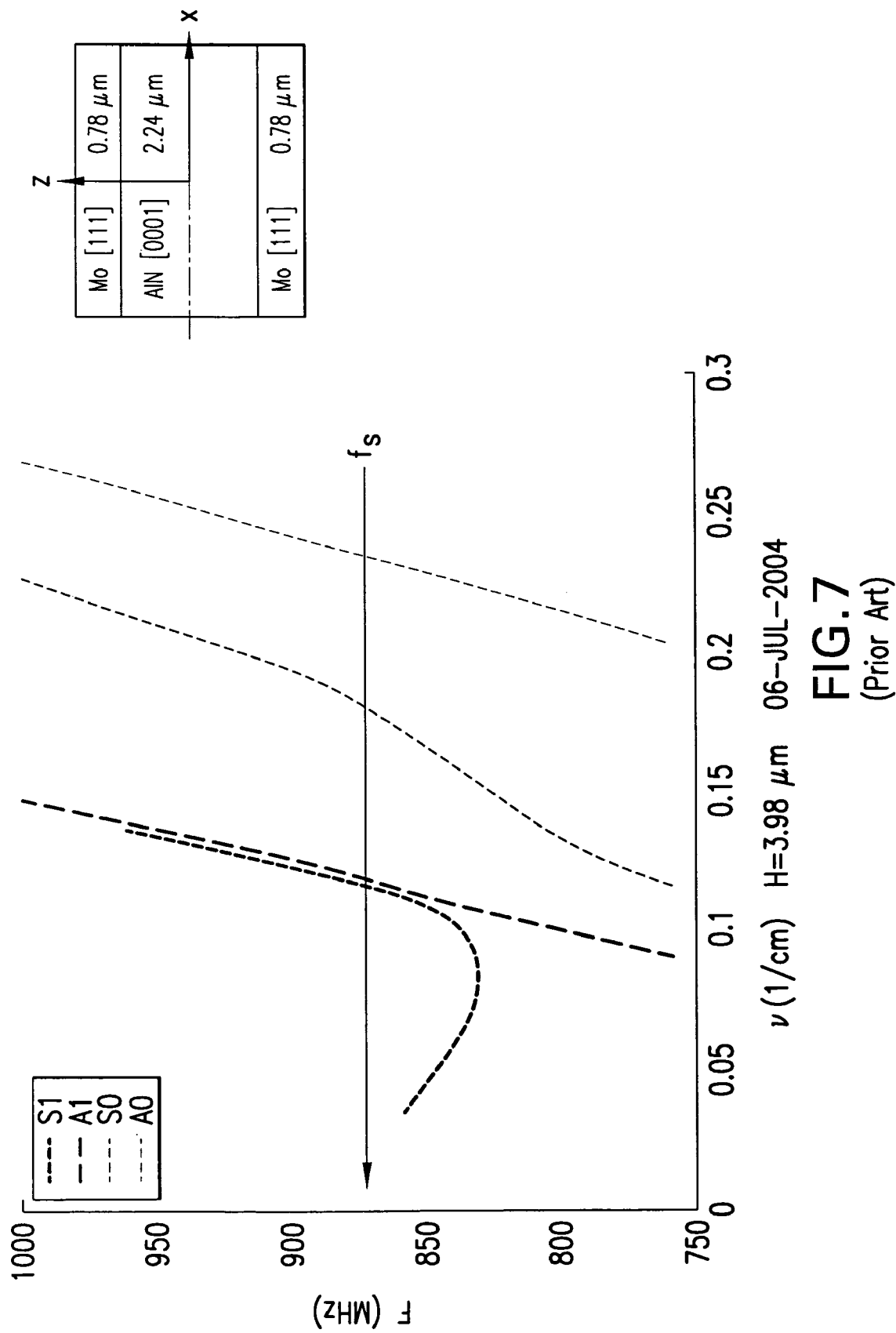

FIG. 7 shows that for the prior art FBAR (shown in FIG. 3A) using AlN as the piezo electric material, we have a Type II piezoelectric where there can exist strong lateral modes below the cut off frequency, fs. This mode is the S1 mode as taught by Telschow in "Laser Acoustic Imaging of Film Bulk Acoustic Resonator (FBAR) Lateral Mode Dispersion", presented at the QNDE conference, Golden, Colo. Jul. 25–30, 2004. However, other symmetric modes exist (S0, S2 . . . ) and asymmetric modes (A0, A1, A2 . . . ) exist both below and above the cut-off frequency. It should be noted that these modes are relatively weak.

Kaitila teaches that in order to reduce the spurious resonances of the lateral mode for a freestanding membrane using AlN (a Type II piezoelectric) a recessed frame must be used. This structure is shown in FIG. 3b.

In FIG. 8 we see the effect of such a structure (versus no recessed frame) on the Q circle (FIG. 8a) and the plot of Γ versus frequency. As taught by Kaitila, the spurious resonances below fs (in the southwest quadrant of the Smith chart) are, indeed, greatly reduced.

However, as can be seen in FIG. 8a, the Q circle for the FBAR with the recessed frame has a much poorer Q. In most places (from 9 o'clock until about 4 o'clock), the Q circle of the recessed frame FBAR has significantly poorer Q. A filter will suffer significantly in terms of roll-off and insertion loss if the Q of the resonator is degraded in this region (9 o'clock to 4 o'clock).

The reason for the degraded Q in this region is that the acoustic impedance in Region 2 (see FIG. 3b) lies between the acoustic impedance of the central region (Region 1) of the resonator and the region beyond the frame (Region 3). If the width of Region 2 is near a certain width, the recessed area can mitigate the acoustic impedance mismatch of the central area of the resonator and the outlying regions. Thus, energy converted from the fundamental extensional mode of the central region into lateral modes more easily "leaks" away from the resonator. In particular, the recessed frame helps suppress the very strong S1 lateral mode, but actually increases the leakage of energy vis a vis the higher mode symmetric and asymmetric lateral modes.

Figure 3C:
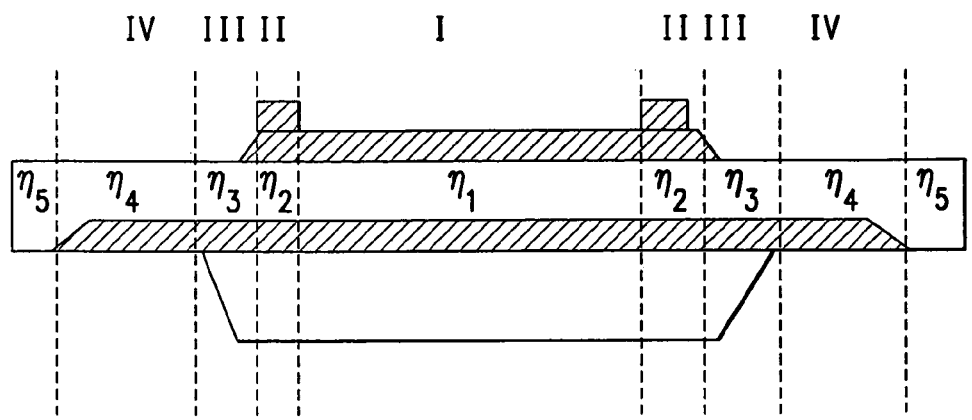

In the present invention, a raised frame is added to the perimeter to create an annulus such that the S1 lateral mode is significantly enhanced. However, the raised frame (assuming the width is chosen correctly) acts as an acoustic impedance mismatch between region I and region III as shown in FIG. 3c. The raised frame adds mass to create this acoustic impedance mismatch. This additional increase of mass can be accomplished by adding more of the same material as the electrode or a different material having a higher specific gravity such as Tungsten or one having a lower specific gravity such as a dielectric, e.g. SiO2 or AlN.

FIGS. 9a and 9b show the effect on the Q circle of an apodized resonator with and without the raised frame at the perimeter. FIG. 9a shows the Smith Chart representation of the two Q-circles and FIG. 9b shows Γ vs. frequency. As can be seen in either figure (a or b) the addition of the raised frame greatly increases "rattles" or "loop-de-loops" seen in the southwest quadrant of the Smith chart. However, from about "9 o'clock" on, the Q of the FBAR with the raised frame more closely "hugs" the edge of the Smith chart thus showing higher Q over a large portion of the frequency range.

In this illustrative example, for a FBAR filter whose function is to pass transmit signals in the 1930 to 1990 MHz region (WCDMA application), a thickness for the frame is ~400 A and the width is about 5 um. The material for the frame and top electrode is Molybedenum. The perimeter ring consistently adds ~1000 Ohms to $R_p$ on our PCM 50 Ohm resonator (PCM=Process Control Monitor). One can measure $R_p$ at the point where the Q circle of a resonator (as measured on a network analyzer such as an Agilent 8510 Network Analyzer) crosses the real axis for a second time on the right hand side of the Smith chart. The frequency at which the Q circle crosses the real axis is fp and the real part of the resonator impedance is $R_p$. For completeness, $f_s$ and $R_s$ are the frequency and value of the real part of the complex impedance of the resonator where it crosses the real axis for the first time on the left hand side of the Smith chart. $R_p$ is directly related to Q by the simple empirically determined relationship $R_p = 1.18 \, kt^2 * Q_p * Z_o$, where $kt^2$ is the effective coupling coefficient and $Z_o$ is the impedance of the resonator, e.g. 50 Ohms. When comparing two resonators side-by-side with the frame (FIG. 3C) and without the frame (FIG. 3A), $kt^2$ is the same for both PCM resonators. Since the areas are the same for the two side by-side resonators, $Z_o$ is the same, thus, $Q_p$ is the parameter that has improved. Typically, we see $R_p$s in the range of 1000 to 2000 Ohms on standard PCM resonators and $R_p$s ranging from 2000 to 3000 Ohms on PCM resonators with raised frames. The invention improves $R_p$ rather than $R_s$ the real resistance of the resonator at $f_s$.

FIG. 3c illustrates an embodiment of the invention. A thin film bulk acoustic resonator (FBAR) is a tri-layer sandwich that includes a bottom electrode and a top electrode made from Molybdenum. Piezoelectric material, e.g. aluminum nitride (AlN) interposes the two electrodes. This trilayer sandwich is deposited over a depression or "swimming pool" made into a substrate, e.g. silicon, where this depression is filled with a sacrificial material. When the sacrificial material is removed, a "free-standing membrane" is created where the edges of the resonator are anchored around the perimeter to the silicon substrate.

The active area is defined as the overlap of the top and bottom electrodes. An annulus corresponding to the perimeter of the active area is added to one of the electrodes. The annulus may be the same material as constitutes the top and bottom electrode, e.g. molybdenum, but it may be made of other materials including dielectrics such as SiO2, AlN, or Si3N4. Alternatively, instead of a raised frame, an outer annulus that surrounds the active area and whose thickness is the same as either electrode but is made of a material with higher acoustic impedance, such as tungsten, could also be used.

The annulus dimensions are selected to improve the electrical properties as measured on resonators (or on filters made with these resonators). This may be determined by experimentation, Finite Element Modeling analysis, or other analytical solutions to determine the width and thickness of this frame.

Region 1, corresponding to the central portion of the active area, has a resonant frequency $f_o$ for the piston mode and an acoustic impedance, $\eta_1$. Region 2 corresponds to the perimeter of the active area. Region 3 corresponds to the area outside of the active area while Region 4 is the area of over the silicon substrate. For each region, there is a corresponding resonant frequency and acoustic impedance. In Region 4, the fundamental resonance is extremely low due to the thickness of the substrate.

While the illustrative embodiment shows the annulus added to the top surface of the top electrode, the annulus may be positioned on the top or bottom surface of either electrode. The annulus may be made made of conductive or dielectric material.

Referring to FIG. 3C, increasing the mass along the perimeter effectively increases the acoustic impedance of Region 2. Thus, a larger impedance mismatch between the center region and outside the center region is created.

There will arise cases when a resonator or a filter using a plethora of such resonators has need of a particularly smooth lateral mode free response and cases where smoothness in the filter response is less of a factor compared to the needed Q.

Figure 10A:
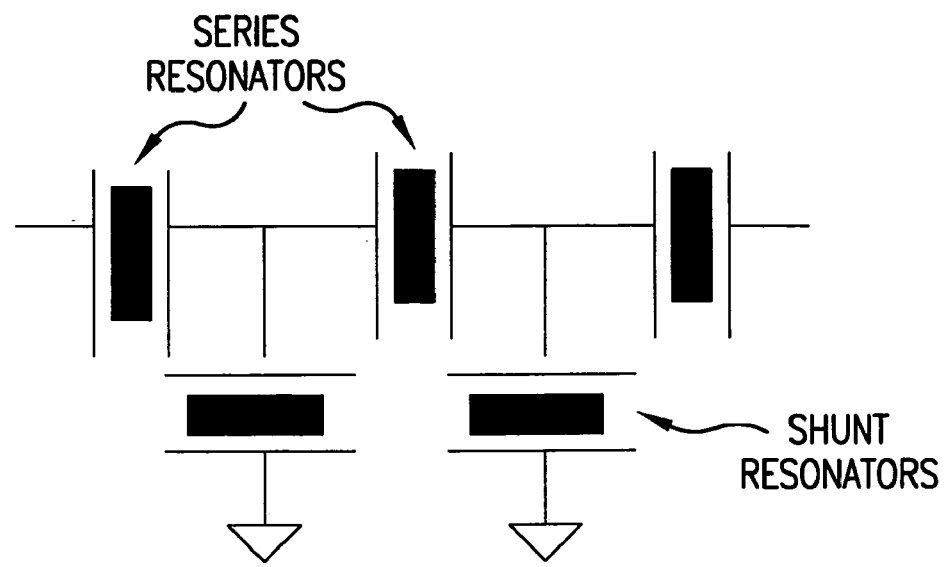
FIG. 10a shows a half ladder filter.
Figure 10B:
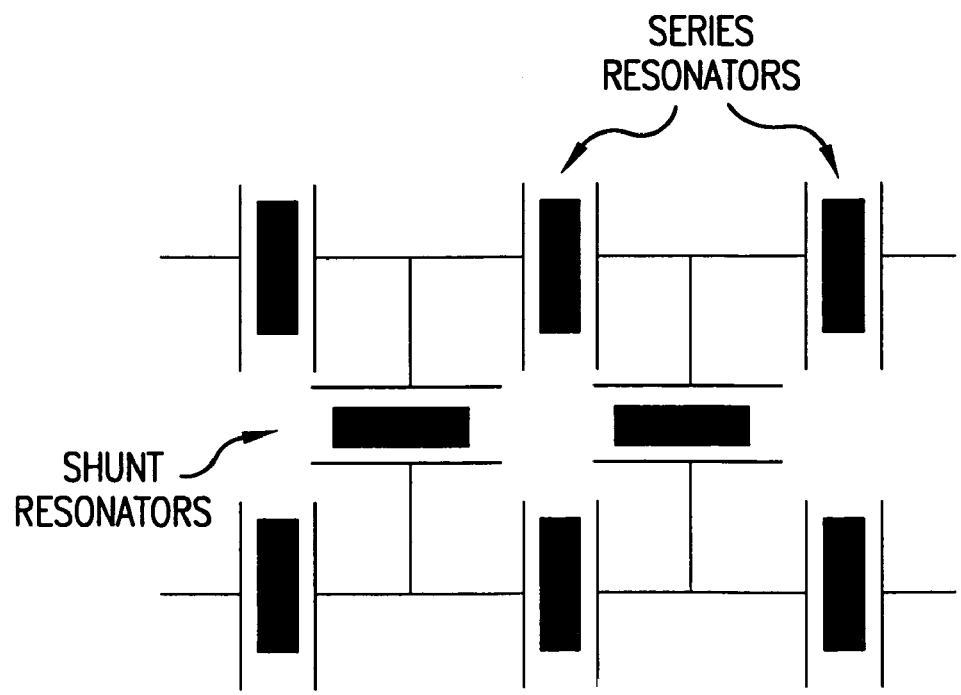
FIG. 10b shows a full ladder filter.

FIGS. 10a and 10b shows two examples of filter topologies: half ladder and full ladder, respectively. The invention is applicable to any filter technology where high Q is needed.

Figure 11:
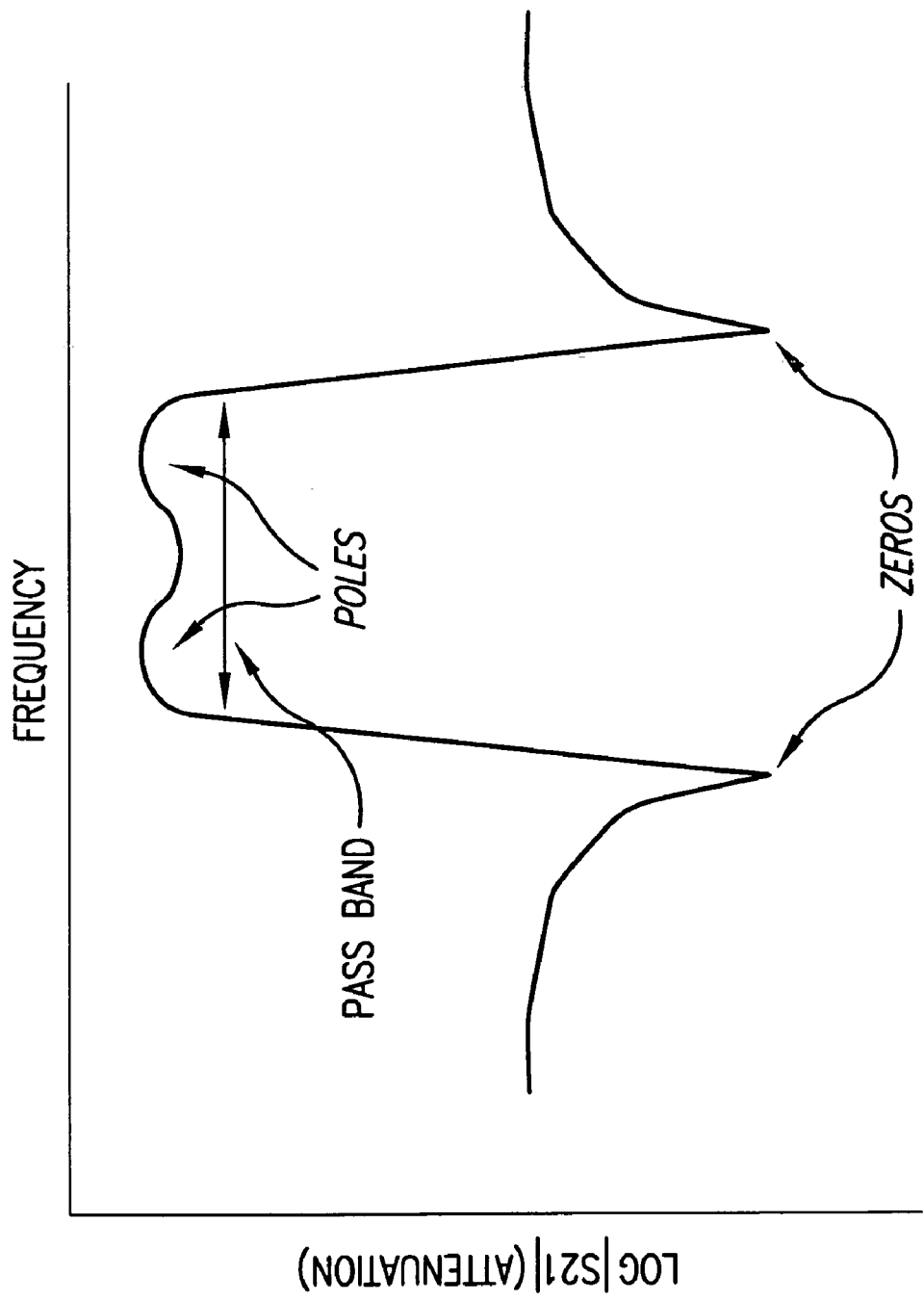
FIG. 11 shows a half ladder filter response.

FIG. 11 shows the response of a typical half-ladder filter having two "zeros" and two "poles". The zeros are two minima while the poles are the two maxima. The lower frequency zero is associated with the extentional resonance (the "piston" mode) of the shunt resonator. Any added "loop-de-loops" or rattles below this frequency will not impact the passband response. Since AlN is a Type II resonator, the increased spurious modes due to enhancement of S1 from the addition of a frame on a shunt resonator all lie below fs of the shunt resonator.

Figure 12A:
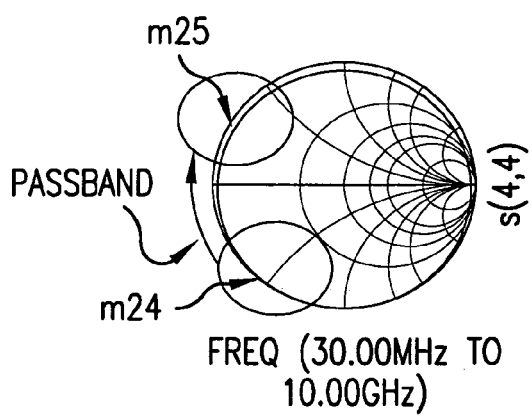
FIGS. 12a–c show the Q circle representing a series resonator in a half ladder topology, a shunt resonator with one mass loading thickness (ML1) and a shunt resonator with another mass loading (ML1 & ML2). The black arrows indicate where on the Q circle would lie the pass band of the filter.
Figure 12B:
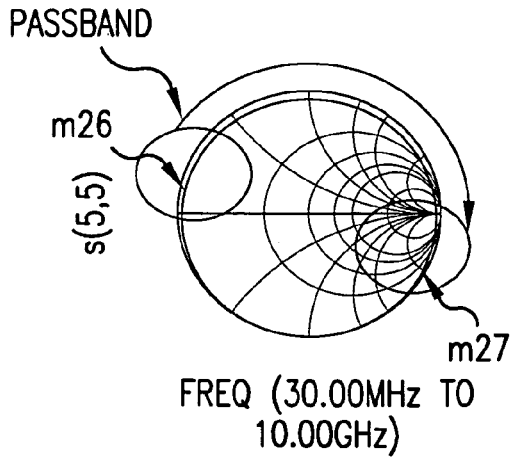
Figure 12C:
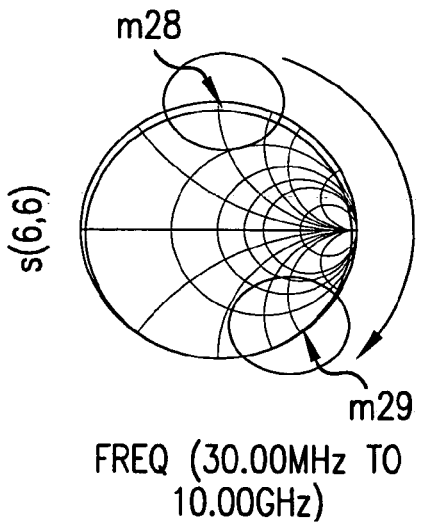

FIGS. 12a–c highlight where on the Q circle lies the pass band. For the series resonators shown in FIG. 10. In FIG. 12a, the pass band lies between "7 o'clock" and approximately "11 o'clock" on the Q circle. Ripple in the passband is negatively impacted by the spurious resonances due to the S1 lateral mode.

However, if one were to look at where the passband frequency lies on a Q circle that represents a shunt resonator (FIGS. 12b and 12c), one can see that for one kind of mass loading, the passband frequencies range from about "10 o'clock" to about "4 o'clock" and for another mass loading the passband frequencies range from "1 o'clock" to "5 o'clock". In all cases, excess "rattles" below fs would not impact the filter.

Figure 13A:
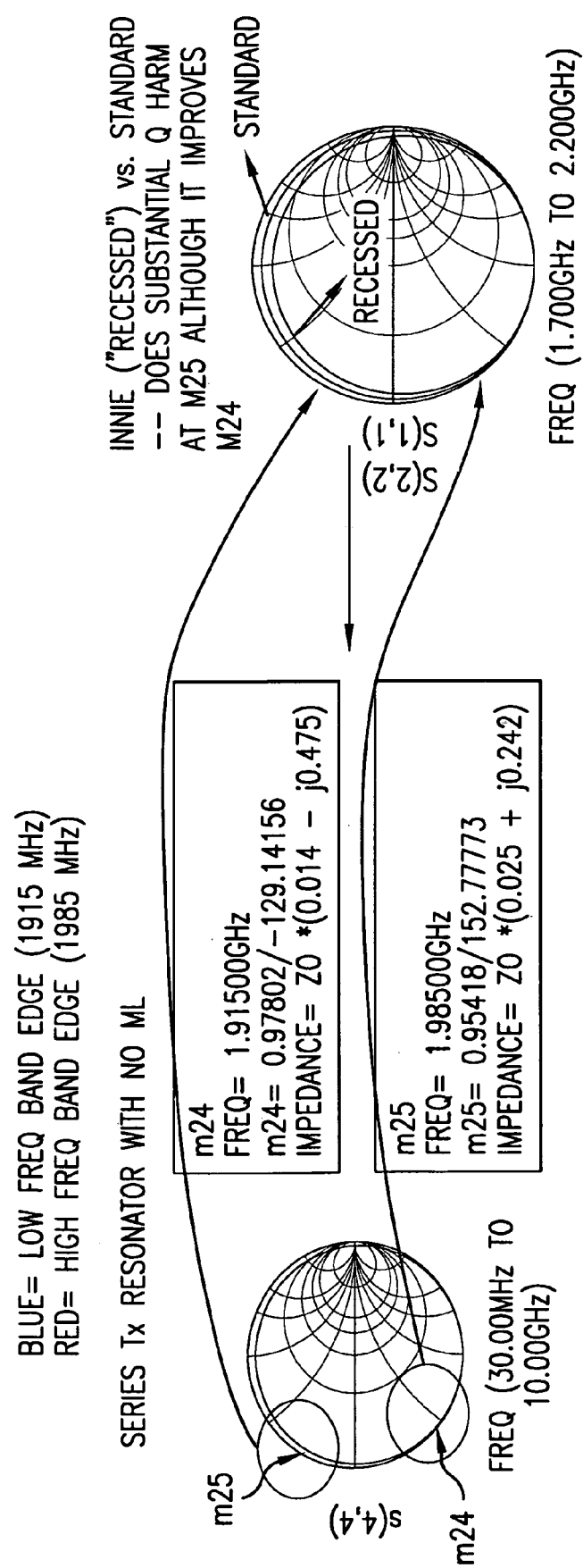
FIGS. 13a–c shows the same thing as FIG. 12a–c except that two Q circles are added showing the recessed frame resonator response and a raised frame resonator response. It can be seen that the recessed frame would materially degrade the filter response since the Q over most of the circle is lower than either a standard prior art FBAR or an FBAR with a raised frame; whereas, the raised frame improves Q over frequencies of interest.
Figure 13B:
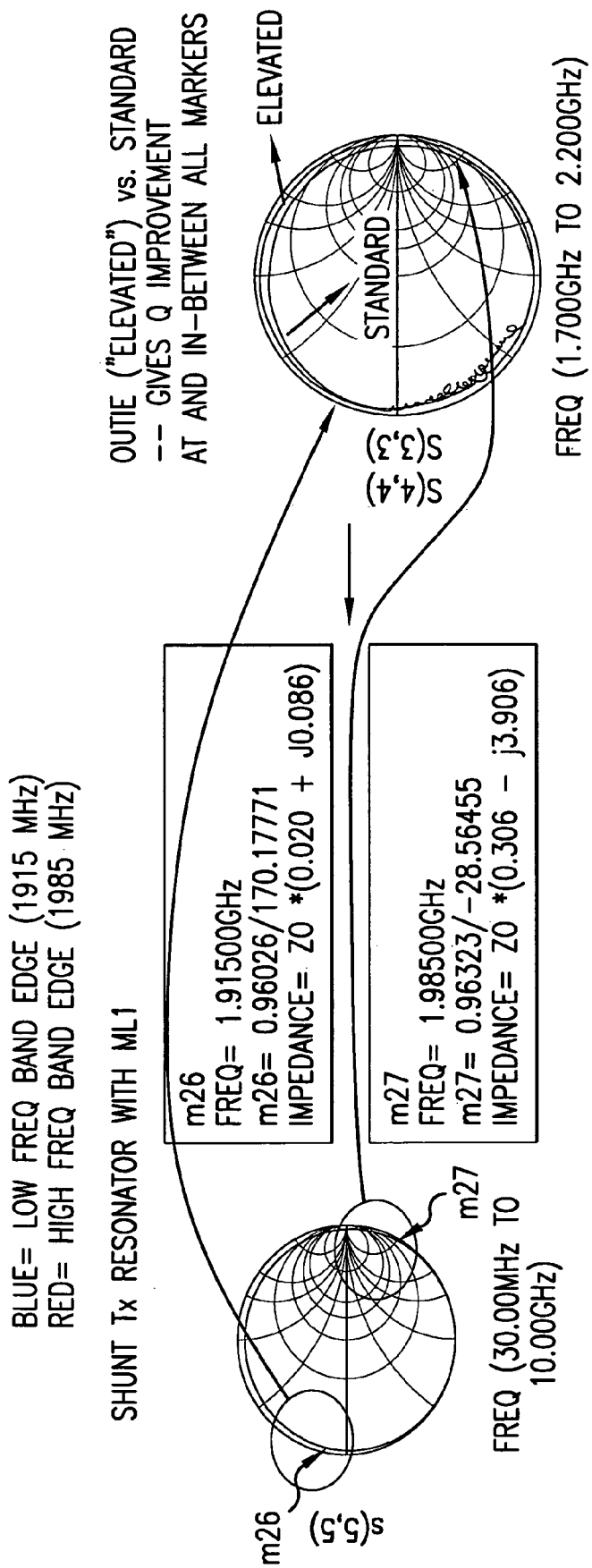
Figure 13C:
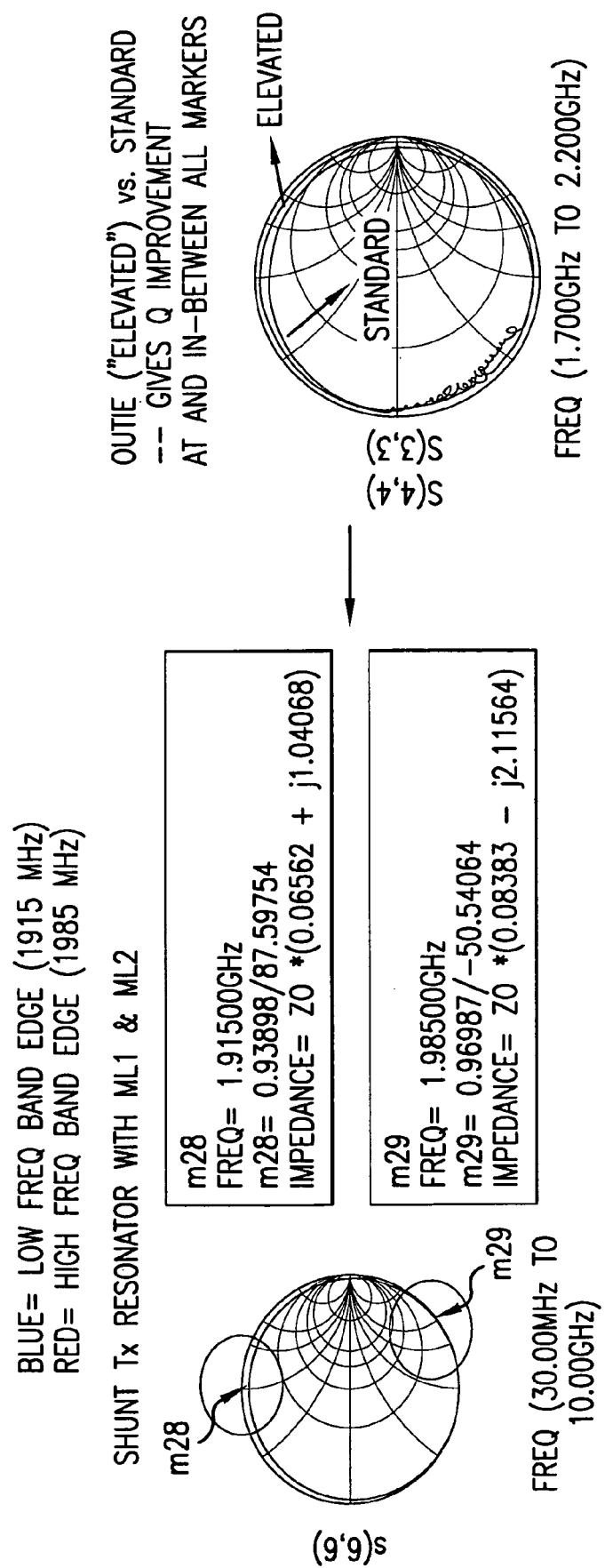
Figure 14A:
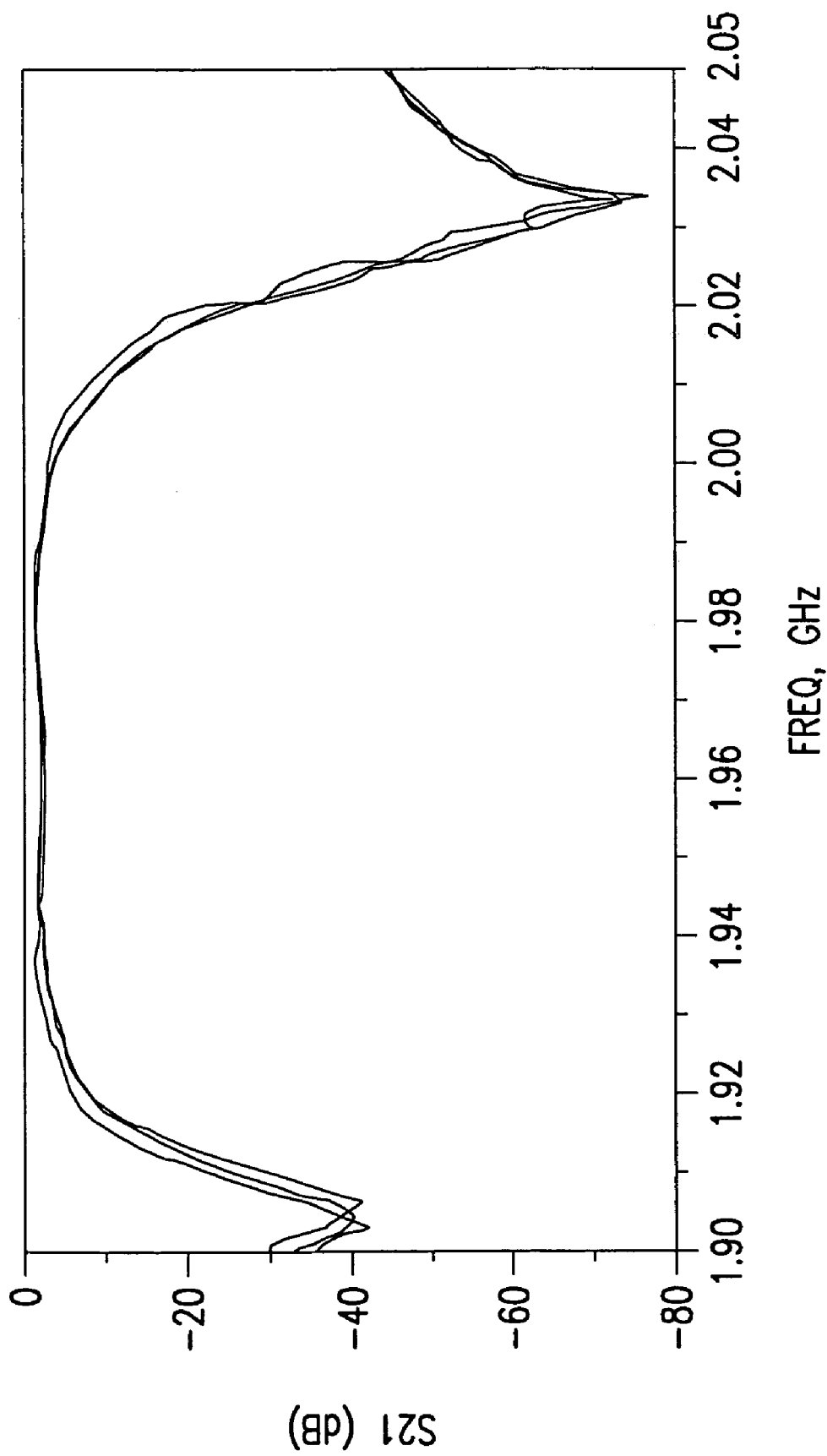
FIGS. 14a and 14b show four filter responses.
Figure 14B:
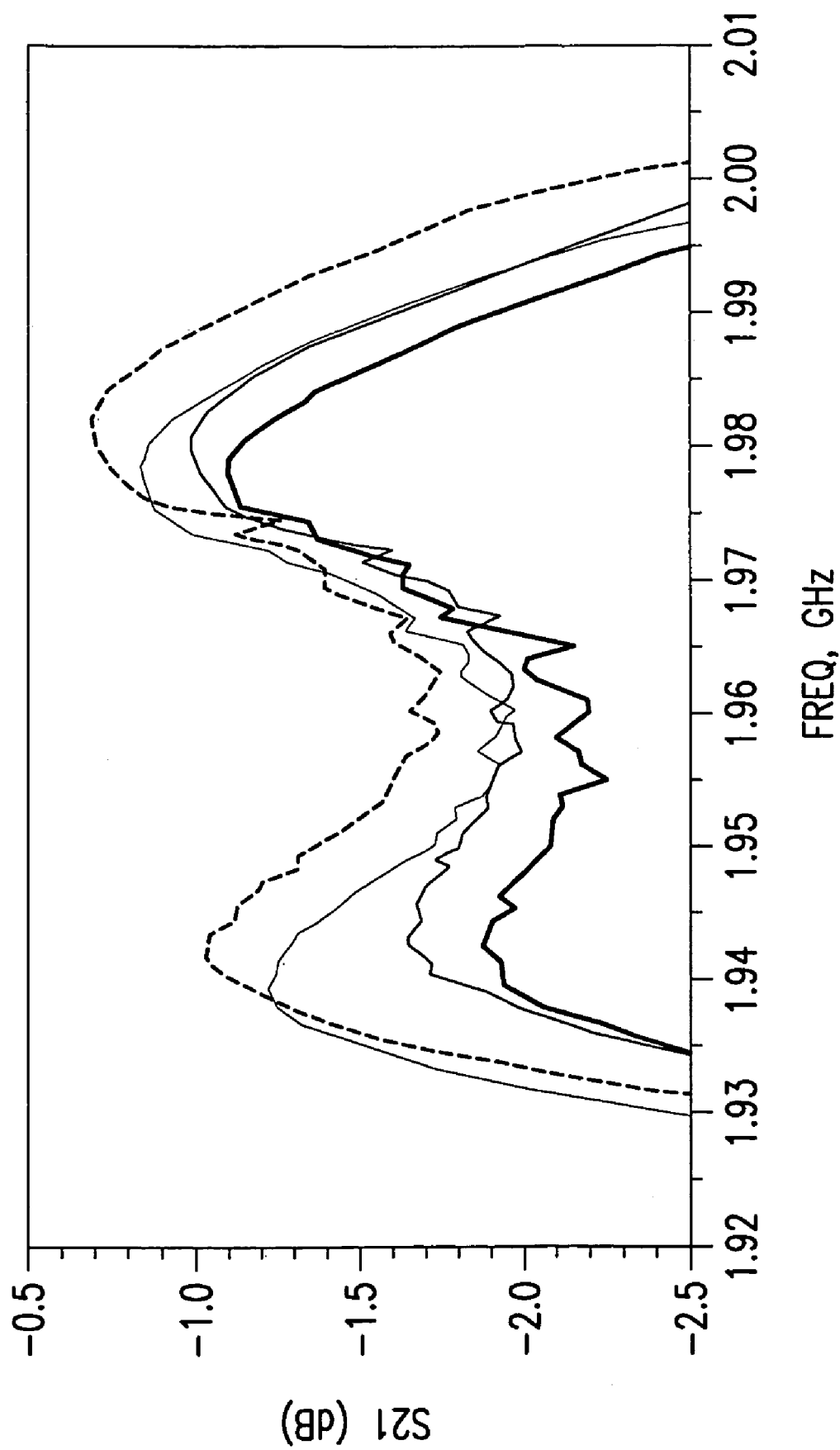

FIG. 13a–c shows Q-circles where the recessed frame and raised frame are highlighted. It is clear that a recessed frame could cause degradation in the filter response. This is seen in FIGS. 14a and 14b. Two half ladder designs are shown with and without raised frames on the shunt resonators (hence 4 curves). For both designs, the addition of the frames significantly helps the insertion loss and the pass band response of the filter.

The invention claimed is:

1. A device for trapping mechanical energy comprising:
   a first electrode;
   a second electrode positioned proximate and above the first electrode; the overlap of the first and the second electrodes defining an active area;
   a dielectric sheet of a type II piezoelectric material interposing the first and the second electrodes;
   a raised annulus positioned on a surface of one of the first and second electrodes;
   wherein the area within the raised annulus has a first acoustic impedance, the raised annulus has a second acoustic impedance, and the region external to the raised annulus has a third acoustic impedance; and
   the second acoustic impedance being greater than the first and the third acoustic impedances to improve the Q factor of the device near a parallel resonant frequency ($f_p$) of the device.

2. A device, as defined in claim 1, wherein the annulus is positioned along the periphery of the second electrode.

3. A device, as defined in claim 1, wherein the annulus is positioned within the first electrode and directly opposes the periphery of the second electrode.

4. A device, as defined in claim 1, wherein the annulus is integrated into the one of the first and the second electrode.

5. A device, as defined in claim 1, wherein:
   the one of the first and second electrode has a first specific gravity; and
   the annulus has a second specific gravity that is greater than the first specific gravity.

6. A device, as defined in claim 1, wherein:
   the one of the first and second electrode has a first specific gravity; and
   the annulus has a second specific gravity that is less than the first specific gravity.

7. A device, as defined in claim 6, the annulus comprising a dielectric material.

8. A device, as defined in claim 6, the annulus comprising a metallic material.

9. A device, as defined in claim 1, further comprising a substrate having a cavity in a surface, the first electrode bridging the cavity.

10. A device, as defined in claim 9, wherein the annulus is positioned along the periphery of the second electrode.

11. A device, as defined in claim 9, wherein the annulus is positioned within the first electrode and directly opposes the periphery of the second electrode.

12. A device, as defined in claim 9, wherein the annulus is integrated into the one of the first and the second electrode.

13. A device, as defined in claim 9, wherein:
   the one of the first and second electrode has a first specific gravity; and
   the annulus has a second specific gravity that is greater than the first specific gravity.

14. A device, as defined in claim 9, wherein:
   the one of the first and second electrode has a first specific gravity; and
   the annulus has a second specific gravity that is less than the first specific gravity.

15. A device, as defined in claim 14, the annulus comprising a dielectric material.

16. A device, as defined in claim 14, the annulus comprising a metallic material.

17. A method for trapping mechanical energy, comprising:
   providing a first electrode;
   providing a second electrode positioned proximate and above the first electrode; the overlap of the first and the second electrodes defining an active area;
   providing a dielectric sheet of a type II piezoelectric material interposing the first and the second electrodes;
   providing a raised annulus positioned on a surface of one of the first and second electrodes; wherein the area within the raised annulus has a first acoustic impedance, the raised annulus has a second acoustic impedance, and the region external to the raised annulus has a third acoustic impedance; and the second acoustic impedance being greater than the first and the third acoustic impedances to improve a Q factor near a parallel resonant frequency ($f_p$).

18. A device, as defined in claim 1, where the type II piezoelectric material is AlN.

19. A device, as defined in claim 1, where the dielectric sheet is part of a free standing membrane.

* * * * *